United States Patent
Suzuki et al.

(10) Patent No.: US 7,452,481 B2
(45) Date of Patent: Nov. 18, 2008

(54) POLISHING SLURRY AND METHOD OF RECLAIMING WAFERS

(75) Inventors: Tetsuo Suzuki, Kobe (JP); Satoru Takada, Foster City, CA (US)

(73) Assignees: Kabushiki Kaisha Kobe Seiko Sho, Kobe-shi (JP); Kobe Precision Inc., Hayward, CA (US)

( * ) Notice: Subject to any disclaimer, the term of this patent is extended or adjusted under 35 U.S.C. 154(b) by 0 days.

(21) Appl. No.: 11/129,444

(22) Filed: May 16, 2005

(65) Prior Publication Data

US 2006/0255314 A1    Nov. 16, 2006

(51) Int. Cl.
*C09K 13/00* (2006.01)
*C09K 13/06* (2006.01)
*H01L 21/461* (2006.01)

(52) U.S. Cl. .................. 252/79.1; 252/79.4; 438/691; 438/692

(58) Field of Classification Search ............... 252/79.1, 252/79.4; 438/692, 691
See application file for complete search history.

(56) References Cited

U.S. PATENT DOCUMENTS

| | | | |
|---|---|---|---|
| 3,170,273 A | 2/1965 | Walsh et al. | |
| 3,328,141 A | 6/1967 | Lachapelle | |
| 6,015,506 A * | 1/2000 | Streinz et al. | 252/186.1 |
| 6,258,140 B1 * | 7/2001 | Shemo et al. | 51/308 |
| 6,451,696 B1 | 9/2002 | Hara et al. | |
| 2002/0016073 A1 * | 2/2002 | Kondo et al. | 438/691 |
| 2002/0151252 A1 | 10/2002 | Kawase et al. | |
| 2004/0194392 A1 * | 10/2004 | Takemiya et al. | 51/307 |
| 2004/0229461 A1 * | 11/2004 | Darsillo et al. | 438/689 |

FOREIGN PATENT DOCUMENTS

JP    2002-226836    8/2002

OTHER PUBLICATIONS

Helene Prigge, et al., "Acceptor Compensation in Silicon Induced by Chemomechanical Polishing", J. Electrochemical Society, vol. 138, No. 5, May 1991, pp. 1385-1389.

* cited by examiner

*Primary Examiner*—Nadine Norton
*Assistant Examiner*—Mahmoud Dahimene
(74) *Attorney, Agent, or Firm*—Oblon, Spivak, McClelland, Maier & Neustadt, P.C.

(57) ABSTRACT

The polishing slurry contains monoclinic zirconium oxide particles having a crystallite size of 10 to 1,000 nm and an average particle diameter of 30 to 2,000 nm in an amount of 1 to 20 weight %, a carboxylic acid having three or more carboxyl groups in the molecule, and a quaternary alkylammonium hydroxide, and has a pH of 9 to 12. The method of reclaiming wafers comprises a step of polishing used test wafers by using the polishing slurry above and removing the films formed on the wafers and the degenerated layers formed on the wafer surfaces, a step of mirror-polishing at least one side of the wafers, and a step of cleaning the wafers.

20 Claims, No Drawings

POLISHING SLURRY AND METHOD OF RECLAIMING WAFERS

BACKGROUND OF THE INVENTION

1. Field of the Invention

The present invention relates to a polishing slurry and a method of reclaiming wafers, and in particular to a chemical mechanical polishing slurry suitable for polishing of silicon wafers and polishing and removal of the films formed on wafers and to a method of reclaiming wafers using the same.

2. Description of the Related Art

Chemical mechanical polishing is a polishing by utilizing, in addition to a mechanical action of a polishing powder, a chemical reaction between the polishing powder and a wafer or between a chemical component in a polishing slurry and a wafer. The chemical mechanical polishing is characteristic in that it allows polishing of hard and brittle materials, allows polishing substantially without forming processing-degenerated layers, provides a smooth mirror surface, and has a higher processing efficiency. The polishing slurry is an important element for the chemical mechanical polishing having such characteristics.

A typical example of an application of the chemical mechanical polishing is polishing of silicon bare wafers. The slurry of colloidal silica dispersed in an aqueous alkaline solution has been used for polishing of silicon wafers. A reason for the use of alkaline colloidal silica is its ability of polishing the wafer surface to an undisturbed mirror surface (see, e.g., U.S. Pat. Nos. 3,170,273 and 3,328,141). The alkaline colloidal silica has been applied not only for polishing of silicon wafers but also for polishing and removal of a non-metal film such as polysilicon film, silicon oxide film and silicon nitride film formed on the wafers.

In the polishing of silicon wafers, a prevention of metal contamination is important. For example, it was shown that when a silicon wafer was polished with a slurry contaminated with Cu, Cu was not only adsorbed on the wafer surface but also penetrated into the wafer (see, Helene Prigge, Peter O. Hahn, Anton Schnegg, and Herbert Jacob, J. Electrochem. Soc., vol. 138, no. 5, pp. 1385-1389 (1991)). Thus, as a polishing slurry for effectively preventing the silicon wafer from the metal contamination, in particular contamination by transition metals such as Cu, Fe, Ni, Cr, and the like, a polishing composition containing a silicon oxide such as colloidal silica or fumed silica, one selected from the group consisting of inorganic salts of alkali metals, ammonium salts, cyclic amines and ethylenediamine, and a carboxylic acid having four to eight carboxyl groups in the molecule was proposed (see Japanese Unexamined Patent Publication No. 2002-226836 and U.S. Patent No. 2002/0151252 A1).

As it is widely understood, polishing of silicon wafers and polishing and removal of the non-metal films formed on wafers are preferably carried out under an alkaline condition. For that reason, the polishing slurry has been usually made alkaline by addition of a pH adjuster. As the pH adjuster, an alkali metal hydroxide such as NaOH or KOH or an alkali metal carbonate such as $Na_2CO_3$ or $K_2CO_3$ has been used. However, these pH adjusters, which contain metal ions, have been considered to be unsuitable for use in polishing in such a process of producing a semiconductor device that demands the protection from the metal contamination. Thus, as the pH adjuster containing no metals, organic amine compounds such as alkanolamines, ethylenediamine and the like and ammonia, have recently been used. The organic amine compounds and ammonia, which do not contain metal ions, are considered to serve to avoid a risk of the metal contamination of wafers.

However, even when the pH of the polishing slurry was adjusted with these compounds, if the polishing slurry was contaminated with Cu, it became apparent that the polishing caused also the Cu penetration into the wafer. For this phenomenon, proposed was a mechanism that Cu first forms a planer tetra-coordinated complex with the organic amine compound or ammonia, the resulting complex is adsorbed on the wafer surface, and thus the Cu is incorporated into the wafer (see, Helene Prigge, Peter O. Hahn, Anton Schnegg, and Herbert Jacob, J. Electrochem. Soc., vol. 138, no. 5, pp. 1385-1389 (1991)). Therefore, even when an organic amine compound or ammonia is used as the pH adjuster, it is quite difficult to avoid the metal contamination of the wafer.

Another example of the application of chemical mechanical polishing is planarization of the multilayer wiring in the process producing the semiconductor device. It is important in the CMP (Chemical Mechanical Polishing) to polish a particular film more efficiently than other films, and many polishing slurries were developed for improving the selectivity of the film removal. For example, in a case of the planarization of Al wiring, an acidic slurry containing an aluminum oxide polishing powder and an oxidizer such as hydrogen peroxide or iron nitrate is used for the purpose of leaving substantially all silicon oxide film that becomes an insulation layer. Alternatively, an alkaline slurry containing fumed silica and an alkali metal hydroxide or ammonia is used for polishing of an insulation film, for example a silicon oxide film.

In addition, the chemical mechanical polishing is used alone or in combination with other chemical etching in reclamation of used test wafers by removal of the films formed thereon. The "used test wafer" means a wafer used in the test for confirming whether the process producing the semiconductor device is adequate, and typical examples thereof include wafers having several layers of films formed on the surface for measurement of film thickness, wafers ejected as defective products from the process producing the semiconductor, and the like.

Use of a mechanical film-removing method such as wrapping or grinding for wafer reclamation results in generation of a processing-degenerated layer having a greater irregularity on the wafer surface after film removal. As a result, the processing-degenerated layer demands additional chemical etching for its removal and increases the burden of the next mirror-polishing step.

In contrast, the chemical mechanical polishing is more advantageously applied to the polishing and removal of films in the reclamation of used test wafers, because, different from the mechanical film-removing method such as wrapping, grinding, or the like, it causes substantially no generation of the processing-degenerated layer on the wafer and reduces the burden of the mirror-polishing step following the film removal. It also leads to a reduction in the decrease of the thickness of wafers during reclamation and thus to an increase in the recycled use rate of the wafers.

In the wafer reclamation treatment, it is important to polish many kinds of films uniformly and simultaneously during removal of the films formed on wafer, which is different from the case in the planarization of multilayer wiring. Thus, as the polishing slurry for reclaiming wafer that enables not only polishing of silicon wafers but also polishing and removal of non-metal films such as polysilicon film, silicon oxide film and silicon nitride film formed on wafers simultaneously and efficiently, U.S. Pat. No. 6,451,696 B1 discloses, for example, a polishing slurry of pH 9 to 12 containing monoclinic zirconium oxide having a primary particle diameter of 30 to 1,000 nm and a crystallite size of 10 to 1,000 nm in an amount of 2 to 20 weight %, and a polishing slurry of pH 9 to 12 containing cerium oxide having a primary particle diameter of 10 to 2,000 nm and an average particle diameter of 30 to 5,000 nm in an amount of 1 to 20 weight %.

Recently, Cu is used more frequently as a wiring material in the process producing the semiconductor device, and thus, the number of used test wafers carrying a Cu film formed thereon is gradually increasing. Consequently, the possibility of mixing of wafers carrying a Cu film in the wafer reclamation process is rising.

Conventional polishing slurries for wafer reclamation, which were developed mainly by focusing on improvement in the film-removing efficiency, were not effective in avoiding the Cu contamination. For example, the polishing slurry disclosed in U.S. Pat. No. 6,451,696 B1 contains an alkali metal hydroxide, an alkali metal carbonate, ammonia, an organic amine compound, or the like as the pH adjuster. Accordingly, when a used test wafer carrying a Cu film is subjected to film polishing and removal by chemical mechanical polishing using such the polishing slurry, Cu may penetrate into the wafer inside after film removal. In addition, all wafers reclaimed may become undesirably contaminated with Cu in the film-removing step.

Thus, there was no polishing slurry that allows polishing of silicon wafers and polishing and removal of various non-metal films formed on wafers simultaneously and efficiently and prevents effectively the metal contamination, in particular Cu contamination, of the wafers during polishing.

SUMMARY OF THE INVENTION

As a result of extensive studies to solve the existing problems above, the present inventors have found that it is necessary to select the polishing powder, the pH adjuster and the chelating agent (scavenger for metal impurities) properly in order to produce the polishing slurry above.

The object of the present invention, which was made to solve the current problems above, is to provide a polishing slurry that allows polishing of silicon wafers and polishing and removal of non-metal films such as polysilicon film, silicon oxide film and silicon nitride film formed on the wafers simultaneously and efficiently and, for example when used for reclamation of used test wafers, prevents effectively metal contamination, in particular Cu contamination, of the wafer even when the polishing slurry is contaminated with Cu or the wafers carrying a Cu film are mixed in the polishing process, and to provide a method of reclaiming wafers that allows efficient reclamation of used test wafers since, for example, a separation of wafers carrying a Cu film from the used test wafers is not required and there is substantially no risk of Cu contamination of all wafers to be reclaimed even when wafers carrying a Cu film are mixed in the polishing process.

The present invention provides a polishing slurry at pH 9 to 12 containing monoclinic zirconium oxide particles having a crystallite size of 10 to 1,000 nm and an average particle diameter of 30 to 2,000 nm in an amount of 1 to 20 weight %, a carboxylic acid having three or more carboxyl groups in the molecule, and a quaternary alkylammonium hydroxide.

The present invention also provides a method of reclaiming wafers, comprising a step of polishing used test wafers by using a polishing slurry at pH 9 to 12 containing monoclinic zirconium oxide particles having a crystallite size of 10 to 1,000 nm and an average particle diameter of 30 to 2,000 nm in an amount of 1 to 20 weight %, a carboxylic acid having three or more carboxyl groups in the molecule, and a quaternary alkylammonium hydroxide, thereby removing the films formed on wafers and the degenerated layers formed on wafer surface; a step of mirror-polishing at least one side of the wafers; and a step of cleaning the wafers.

The method of reclaiming wafers according to the present invention may additionally comprise as needed a step of removing at least part of the films by chemical etching before the step of polishing used test wafers, and/or a step of cleaning the wafers after the step of polishing used test wafers and before the step of mirror-polishing at least one side of wafer.

The quaternary alkylammonium hydroxide is preferably at least one compound selected from the group consisting of tetramethylammonium hydroxide, tetraethylammonium hydroxide and choline.

The carboxylic acid having three or more carboxyl groups in the molecule is preferably at least one compound selected from the group consisting of citric acid and the salts thereof, ethylenediamine tetraacetic acid and the salts thereof, diethylenetriamine pentaacetic acid and the salts thereof, and poly(meth)acrylic acid and the salts thereof.

DETAILED DESCRIPTION OF THE PREFERRED EMBODIMENTS OF THE INVENTION

<Polishing Slurry>

The polishing slurry according to the present invention contains monoclinic zirconium oxide particles having a crystallite size of 10 to 1,000 nm and an average particle diameter of 30 to 2,000 nm in an amount of 1 to 20 weight % as a polishing powder, and in addition a carboxylic acid having three or more carboxyl groups in the molecule as a chelating agent and a quaternary alkylammonium hydroxide as a pH adjuster. Accordingly, the polishing slurry enables polishing of silicon wafers and polishing and removal of non-metal films such as polysilicon film, silicon oxide film, and silicon nitride film formed on wafers efficiently at the same time, and further, for example when used for reclamation of used test wafers, prevents Cu contamination of the wafer effectively even when the polishing slurry is contaminated with Cu or when wafers carrying a Cu film are mixed in the polishing process.

Hereinafter, three important components contained in the polishing slurry according to the present invention, namely, the polishing powder, the pH adjuster and the chelating agent, will be described in detail. The polishing slurry according to the present invention may contain conventionally known additives commonly added to polishing slurries such as a dispersing agent, a buffer agent, and a viscosity adjuster, as far as the advantageous effects of the invention are not impaired.

<Polishing Powder>

Monoclinic zirconium oxide is used as the polishing powder contained in the polishing slurry according to the present invention. Zirconium oxide is known to exhibit reversible phase transition between monoclinic system at lower temperature and tetragonal system at higher temperature at around 1,000° C. The phase transition is often affected by trace amounts of impurities and the phase transition temperature changes. Zirconium oxide containing calcium oxide, magnesium oxide or a rare-earth metal oxide in an amount of several % is known to show no phase transition and has a tetragonal crystalline system in a stabilized structure. Zirconium oxide in a tetragonal crystalline system stabilized by addition of trace amounts of impurities is called stabilized zirconia.

Zirconium oxide is used as an abrasive for glass and others. Studies on the effects of the crystal system and the crystallite size of zirconium oxide on polishing characteristics revealed that monoclinic zirconium oxide having a crystallite size of 10 to 1,000 nm and average particle diameter of 30 to 2,000 nm, preferably 30 to 1,000 nm, was particularly favorable for removal of various non-metal films formed on wafer. The average particle diameter should be at least about 30 nm for obtaining the monoclinic zirconium oxide having a crystallite size of 10 nm or more. Zirconium oxide having an average particle diameter of more than 2,000 nm often causes scratches on the polishing surface and thus is not suitable as a polishing powder for chemical mechanical polishing.

The crystallite is a mass of zirconium oxide molecules that may be regarded as a single crystal, and a piece of particle contains a plurality of crystallites. As the crystallite size decreases, the number of crystallites in a particle increases. The average particle diameter means the average diameter of a particle containing the crystallites (primary particle diameter). The crystallite size is determined by powder X-ray diffraction according to Sherrer's method. The average particle diameter is determined according to a laser diffraction/scattering method.

The monoclinic zirconium oxide may be prepared by pulverization and classification of natural baddelyte or synthesized by adjusting a pH of an aqueous solution of a zirconium salt such as zirconium oxychloride or zirconium oxynitrate and then spraying the solution into a high-temperature atmosphere. Alternatively, it may be prepared by generating zirconium hydroxide precipitates from an aqueous solution of a zirconium salt by pH adjustment, calcinating the precipitates in an air atmosphere, and pulverizing and classifying the zirconium oxide thus obtained. When the zirconium oxide is prepared by calcinating zirconium hydroxide, the crystallite size of the monoclinic zirconium oxide increases as the calcination temperature is raised. The calcination temperature is 800° C. or more and preferably 1,000 or more. Because transition to the trigonal system occurs at 1,900° C., the highest allowable calcination temperature is in principle this temperature, but the zirconium oxide is baked at a lower temperature rather for economical and operational reasons.

So-called aqueous zirconia sols, which are produced according to a generally known method of producing aqueous metal oxide sols such as colloidal silica or the like that an aqueous solution of a metal salt is subjected to a dehydration polymerization at a suitable pH and temperature, have a lower crystallinity and thus are not suitable as the polishing slurry according to the present invention.

The polishing powder is added to a polishing slurry in an amount of 1 to 20 weight %, preferably 2 to 10 weight %. A polishing slurry containing the polishing powder at a blending amount less than 1 weight % may result in drastic drop in polishing speed. A polishing slurry containing the polishing powder at a blending amount more than 20 weight % may result in more frequent aggregation of the polishing powder and generation of scratches on the polishing surface.

<pH Adjuster>

The polishing slurry according to the present invention is adjusted to a pH of 9 to 12 by using a pH adjuster. At a pH in this range, it is possible to polish efficiently and also disperse the polishing powder, monoclinic zirconium oxide, in the slurry in a stabilized manner without reaggregation. Use of a surfactant, a surface modifier, or the like is effective in producing a more stabilized dispersion.

In addition, when used as the pH adjuster of polishing slurry, a quaternary alkylammonium hydroxide, which contains no metal ion and does not form a planer tetra-coordinated complex with Cu, can prevents metal contamination, especially Cu contamination, of the wafer during polishing.

When a polishing powder of monoclinic zirconium oxide and a pH adjuster of quaternary alkylammonium hydroxide are used in combination, as shown below in the experiment 2, it becomes possible to polish silicon wafers and polish and remove non-metal films such as polysilicon film, silicon oxide film and silicon nitride film efficiently at the same time and to prevent Cu contamination of wafers even when, for example, polishing slurry is contaminated with Cu or wafers carrying a Cu film are mixed in the polishing process.

Typical examples of the quaternary alkylammonium hydroxides for use as the pH adjuster include tetramethylammonium hydroxide, tetraethylammonium hydroxide, choline, tetrapropylammonium hydroxide, tetrabutylammonium hydroxide, benzyltrimethylammonium hydroxide, benzyltriethylammonium hydroxide, and the like. These quaternary alkylammonium hydroxides may be used alone or in combination of two or more. Among these quaternary alkylammonium hydroxides, tetramethylammonium hydroxide, tetraethylammonium hydroxide and choline are favorable.

The amount of the pH adjuster added is not particularly limited, if it is suitable for adjusting the pH of polishing slurry within the range of 9 to 12.

In the CMP process used by the production of semiconductor devices, colloidal silica, fumed silica, cerium oxide and the like are used for polishing of non-metal films. However, use of these polishing powders in combination with a quaternary alkylammonium hydroxide makes it difficult to polish a silicon wafer and non-metal films such as polysilicon film, silicon oxide film and silicon nitride film efficiently at the same time. For example, combined use of colloidal silica and tetramethylammonium hydroxide allows efficient polishing of silicon wafer and polysilicon film but allows polishing of silicon oxide and silicon nitride films only at a significantly lower speed. Alternatively, combined use of cerium oxide and tetramethylammonium hydroxide allows efficient polishing of silicon oxide and silicon nitride films but allows polishing of silicon wafer and polysilicon film only at a significantly lower speed.

<Chelating Agent>

A polishing slurry containing a quaternary alkylammonium hydroxide as the pH adjuster and monoclinic zirconium oxide particles having a crystallite size of 10 to 1,000 nm and an average particle diameter of 30 to 2,000 nm as the polishing powder contains neither metal ions in the slurry nor organic amine compounds and ammonia which accelerate Cu contamination, and thus seldom results in metal contamination of the silicon wafers after polishing.

However, even with the polishing slurry having such a composition, it is quite difficult to prevent Cu contamination of wafers, for example, when the slurry is contaminated with Cu at the ppm level or wafers carrying a Cu film are mixed in the polishing process. For preventing the Cu contamination effectively even under such conditions, the slurry should contain additionally a chelating agent that reacts with the Cu ion invaded into the slurry and changes the ion into an inactive form so that the ion cannot penetrate into the wafer substantially.

The present inventors have found that among chelating agents forming a stable complex with a Cu ion in the range of pH 9 to 12, carboxylic acids having three or more carboxyl groups in the molecule are effective as the chelating agent in preventing the Cu penetration into wafers during polishing. Accordingly, the carboxylic acid having three or more carboxyl groups in the molecule is added to the polishing slurry of the present invention as the chelating agent.

Typical example of the carboxylic acids having three or more carboxyl groups in the molecule for use as the chelating agent include citric acid, isocitric acid, aconitic acid, ethylenediamine triacetic acid (EGTA), N-hydroxyethylethylenediamine triacetic acid (HEDTA), nitrilotriacetic acid (NTA), ethylenediamine tetraacetic acid (EDTA), 1,3-propanediamine tetraacetic acid (PDTA), 1,3-diamino-2-hydroxypropane tetraacetic acid (DPTA-OH), diethylenetriamine pentaacetic acid (DTPA), triethylenetetramine hexaacetic acid (TTHA), poly(meth)acrylic acid (the weight-average molecular weight is not particularly limited but preferably 1,000 to 500,000, more preferably 2,000 to 400,000, and still more preferably 3,000 to 300,000), the salts of these carboxylic acids, and the like. These carboxylic acids may be used alone or in combination of two or more. Among these carboxylic acids, citric acid and the salts thereof, ethylenediamine tetraacetic acid and the salts thereof, diethylenetriamine pentaacetic acid and the salts thereof, and poly(meth) acrylic acid and the salts thereof are favorable.

The amount of the chelating agent added is not particularly limited as it varies according to the estimated concentration of Cu contamination, but an excessively smaller amount of the chelating agent may result in decrease in the advantageous effect of preventing Cu contamination. Accordingly, the amount of the chelating agent added is preferably 0.001% or more and more preferably 0.005% or more. The upper limit of the amount of the chelating agent added is also not particularly limited, but an excessively larger amount of chelating agent may demand an increase in the amount of pH adjuster needed, raising the production cost for the polishing slurry.

The reason for the fact that such a chelating agent is effective in preventing Cu penetration into the wafer during polishing is yet to be known, but is considered, for example, as follows: Cu in the contaminated polishing slurry is a bivalent cation, and the carboxyl groups dissociate under the condition of a pH of 9 to 12 and are present as negative ions. Because one Cu ion and two carboxyl groups bind to each other forming a stable complex, the chelating agent having three or more carboxyl groups still has extra carboxyl groups in the form of negative ion, carrying negative charges as a whole complex even after complex formation. On the other hand, silicon wafer is known to have a negative surface potential under the condition of a pH of 9 to 12, and thus repels to the complex electrostatically, consequently preventing Cu contamination.

In contrast, organic amine compounds form a stable complex with a bivalent Cu ion, a planar four-coordinated complex wherein one Cu ion is bound to four nitrogen atoms of the amino groups. An electrostatic attracting force is generated between the complex being a bivalent cation as a whole and the silicon wafer having a negative surface potential. As a result, coexistence of an organic amine compound or ammonia with Cu accelerates Cu contamination of the wafer.

If the mechanism of the metal contamination of wafers is as described above, a carboxylic acid having a large number of carboxyl groups in the molecule would generally form a stable complex with a large number of metal ions except monovalent metal ions. Thus, by using a carboxylic acid having three or more carboxyl groups in the molecule as the chelating agent, it becomes possible to prevent contamination by bivalent cations of Mg, Ca, Ni, Zn, and the like in addition to Cu, and also to prevent contamination by trivalent cations of Al, Cr, Fe, and the like in addition to the bivalent metal cations by using the carboxylic acid having four or more carboxyl groups in the molecule.

<Production of Polishing Slurry>

The polishing slurry according to the present invention can be produced by using a conventionally known method of producing an aqueous polishing slurry. For example, the polishing powder is added into water, preferably deionized pure water, in a suitable amount and the mixture is subjected to dispersion as needed by adding a suitable amount of a dispersing agent. Publicly known general dispersing machines may be used for dispersion. The dispersing machine is not particularly limited, and typical examples thereof include ultrasonic homogenizer, high-pressure homogenizer, rotating blade dispersing machine, kneader, bead mill, ball mill, and the like. Then, the aqueous dispersion obtained is added with the chelating agent in a suitable amount, and the mixture is adjusted to the pH in the range of 9 to 12 with the pH adjuster and mixed thoroughly, to give the polishing slurry. The chelating agent and the pH adjuster may be added any time, for example, during dispersion of the polishing powder. The order of adding the chelating agent and the pH adjuster is also not particularly limited, but it is preferable to adjust the pH of polishing slurry in a predetermined range by adding the chelating agent first and then the pH adjuster.

<Use of Polishing Slurry>

The polishing slurry according to the present invention can be used, for example, for polishing of silicon bare wafers, polishing of silicon wafers in the process for producing semiconductor devices, polishing of non-metal films such as polysilicon film, silicon oxide film and silicon nitride film formed on silicon wafers, planalization of interlayer insulation films, and the like. It is favorably used in reclamation of used test wafers, because it effectively prevents Cu contamination of wafers, for example, even when wafers carrying a Cu film are mixed in the polishing process.

<Method of Reclaiming Wafers>

The method of reclaiming wafers according to the present invention is a method of reclaiming wafers by polishing a used test wafer by using the polishing slurry above and thus removing the films formed on wafer and the degenerated layers formed on wafer surface. The "film" means a metal film and/or a non-metal film formed on the wafer. Alternatively, the "degenerated layer" means an area on the wafer surface into which impurities are injected and/or diffused.

The method of reclaiming wafers according to the present invention comprises a step of removing the films formed on used test wafers and the degenerated layers formed on wafer surfaces by polishing the wafers with a polishing slurry containing monoclinic zirconium oxide particles having a crystallite size of 10 to 1,000 nm and an average particle diameter of 30 to 2,000 nm in an amount of 1 to 20 weight %, a carboxylic acid having three or more carboxyl groups in the molecule, and a quaternary alkylammonium hydroxide at pH 9 to 12 (hereinafter, referred to as "chemical mechanical polishing step"); a step of mirror-polishing at least one side of the wafer (hereinafter, referred to as "mirror-polishing step"); and a step of cleaning the wafers (hereinafter, referred to as "final cleaning step"). For example, because it is not necessary to separate wafers carrying a Cu film from used test wafers and, in addition, all wafers to be reclaimed are substantially free from Cu contamination even when wafers carrying a Cu film are mixed in the polishing process, it becomes possible to reclaim used test wafers efficiently.

The method of reclaiming wafers according to the present invention may comprise additionally as needed a step of removing at least part of the films by chemical etching (hereinafter, referred to as "chemical etching step") before the step of polishing used test wafers, and/or a step of cleaning the wafer (hereinafter, referred to as "preliminary cleaning step") after the step of polishing used test wafers and before the step of mirror-polishing at least one side of wafer.

Hereinafter, three important steps included in the method of reclaiming wafers according to the present invention, namely, chemical mechanical polishing step, mirror-polishing step and final cleaning step, and the chemical etching step and preliminary cleaning step included as needed therein will be described in detail. The method of reclaiming wafers according to the present invention is not limited to these steps, and may contain as needed any one of other publicly known steps, for example, of cleaning, drying, polishing, heating, and inspecting at a suitable phase.

<Chemical Mechanical Polishing Step>

The films formed on wafers and the degenerated layers formed on wafer surfaces are first removed by chemical mechanical polishing of the used test wafers by using the polishing slurry according to the present invention. Alternatively, if at least parts of the films formed on wafers are removed as needed by chemical etching described below in advance to the chemical mechanical polishing, the residual films are removed by chemical mechanical polishing of the wafer by using the polishing slurry according to the present invention. The "residual film" means a film still remaining on the wafer after chemical etching.

Any of one-face or two-face polishing machines may be used for the chemical mechanical polishing. When a one-face polishing machine is used, one face of a wafer is polished one by one, for example, by adhering the wafer onto a ceramic plate, placing it thereon firmly by vacuum chuck or placing it on a template, and rotating while supplying a polishing slurry. When a two-face polishing machine is used, both faces of a wafer are polished simultaneously, for example, by placing the wafer on a carrier and holding it between a pair of mutually facing rotating pads while supplying the polishing slurry. The polishing pressure is preferably 100 $g/m^2$ or more and more preferably 150 $g/m^2$ or more. The polishing time is not particularly limited and may be decided according to the thickness of the films and the degenerated layers to be removed, but generally approximately 3 to 30 minutes.

<Chemical Etching Step>

Used test wafers often carry metal films formed as wiring materials, and thus, at least part of the films formed on wafer, for example metal films exposed on the surface, may be removed as needed by chemical etching before the chemical mechanical polishing.

The method of chemical etching is not particularly limited, but preferably a method of wet etching by using an etchant. Any one of publicly known general chemical etching machines may be used for the chemical etching.

The etchant for use in chemical etching is not particularly limited, and typical examples thereof include etchants derived from phosphoric acid, sulfuric acid, hydrofluoric acid, hydrofluoric acid-nitric acid, hydrochloric acid-nitric acid, and the like. These etchants may be used alone or in combination of two or more. In addition, the two or more etchants may be used as mixed or in turn when used in combination.

Etchants derived from phosphoric acid, sulfuric acid, hydrofluoric acid, and hydrochloric acid-nitric acid do not dissolve silicon even at higher concentration. Although hydrofluoric acid-nitric acid-based etchants dissolve silicon, they can remove metal films efficiently under the condition that they do not dissolve silicon substantially (decrease in thickness: 1 µm or less) when diluted with water.

For example, although a hydrofluoric acid-nitric acid-based etchant dissolves silicon wafer, an etchant adjusted in its composition and concentration, for example at a ratio of 49% hydrofluoric acid:69% nitric acid:water being 1:1:5 (by volume), removes not only metal films of Al, Cu, and the like but also part of the non-metal films such as silicon oxide film and silicon nitride film only by immersing the used test wafer in the etchant at room temperature for 10 minutes. This etchant leaves non-metal films such as hard silicon oxide films and silicon nitride films unetched, when the etching efficiency is decreased in compared to a more concentrated etchant containing a smaller amount of water. Examples of the hard silicon oxide films and the silicon nitride films include silicon oxide and silicon nitride films chemically vacuum deposited (CVD) at high temperature and the like. Part of the silicon wafer surface exposed after removal of the films is also removed at the same time, but the decrease in the thickness of wafer is 1 µm or less when the wafer is treated with this etchant at normal temperature for 10 minutes, causing practically no problem of deterioration in board flatness.

In addition, metal films of Al, Cu, and the like and silicon oxide films can be almost completely removed, for example, by immersing a used test wafer for 10 minutes in an etchant of an aqueous 25% solution of sodium peoxodisulfate and 96% conc. sulfuric acid at a 1:1 ratio (by volume) heated at 100° C., cleaning the wafer with water, and then immersing it in an etchant of 49% hydrofluoric acid and water at a 1:1 ratio (by volume) for 10 minutes. When a wafer is treated in these etchants, the decrease in thickness during etching is approximately 0.05 µm.

Further, metal films of Al, Cu, and the like can be removed, for example, by immersing a used test wafer for 10 minutes in an etchant of 37% hydrochloric acid, 69% nitric acid, and water at a 1:1:2 ratio (by volume). When treated with this etchant, the decrease in the thickness of the wafer during etching is approximately 0.05 µm.

The composition and concentration of the etchant is not limited to the typical examples above, and an etchant having any other composition or concentration may be used as far as the etchant can remove at least part of the films formed on the used test wafers and the decrease in thickness is 1 µm or less.

<Preliminary Cleaning Step>

The wafer after the completion of chemical mechanical polishing is subjected to mirror-polishing for removal of the roughness of the surface formed in the process (microroughness), but may be cleaned preliminarily as needed in advance to the mirror-polishing step because the wafer is often contaminated with polishing powder and metals by the chemical mechanical polishing.

The washing water used in preliminary cleaning is not particularly limited, and typical examples thereof include washing water commonly used such as ammonia-hydrogen peroxide system (often called "APM"), hydrofluoric acid-hydrogen peroxide system (often called "FPM"), hydrochloric acid-hydrogen peroxide system (often called "HPM"), dilute hydrofluoric acid system (often called "DHF"), and the like. Among these washing waters, a washing water of the ammonia-hydrogen peroxide system, for example, a washing water of 27% aqueous ammonia, 30% hydrogen peroxide solution, and water at a 1:1:5 ratio (by volume) and a washing water of the hydrofluoric acid-hydrogen peroxide system, for example, a washing water of 49% hydrofluoric acid, 30% hydrogen peroxide solution, and water at a 1:1:100 ratio (by volume) are preferable. These washing waters may be used alone or in combination of two or more. In addition, the two or more washing waters may be used as mixed or in turn when used in combination.

The method of cleaning is not particularly limited, and the wafer is washed, for example, by multi-tank batch cleaning, single-tank batch cleaning, sheet-fed cleaning, or the like. Ultrasonic wave or jet flow, for example, may be used for improving the cleaning efficiency. The cleaning temperature is not particularly limited and may be adjusted according to the kind of the washing water. For example, when the washing water of the hydrofluoric acid-hydrogen peroxide system is used, a room temperature is preferable, and when the washing water of the ammonia-hydrogen peroxide system or the hydrochloric acid-hydrogen peroxide system is used, a temperature of 40° C. to 80° C. is preferable. An excessively shorter cleaning time may result in insufficient removal of contamination, while an excessively longer cleaning time in deterioration of the smoothness of wafer surface. Thus, the cleaning time is generally approximately 3 to 20 minutes.

<Mirror-Polishing Step>

The surface roughness (microroughness) of the wafers formed during chemical mechanical polishing or the wafers formed during chemical mechanical polishing followed by preliminary cleaning as needed is removed by mirror-polishing. The mirror polishing is performed to at least one face of the wafers, preferably to the face which is reused in the process producing the semiconductor device.

The polishing slurry used in the mirror-polishing is not particularly limited, and typical examples thereof include ordinary polishing slurries for silicon wafers such as those containing alkaline colloidal silica, and the like. The mirror polishing may be carried out only once, or twice or more, for example, as divided into primary polishing and final polishing.

Either a one-face or a two-face polishing machine may be used for mirror polishing. The polishing method is similar to that for the chemical mechanical polishing. The polishing pressure is preferably 100 g/m$^2$ or more and more preferably 150 g/m$^2$ or more. The polishing time is preferably approximately 3 to 30 minutes and more preferably approximately 5 to 15 minutes.

<Final Cleaning Step>

The wafer after mirror polishing, which is contaminated with the polishing powder and metals during the mirror polishing, is subjected to final cleaning. Methods of the final cleaning include, for example, ordinary RCA cleaning, ozone cleaning, electrolytically ionized water cleaning, and the like. These cleaning methods may be used alone or in combination of two or more. Among these cleaning methods, ordinary RCA cleaning is favorable.

The "ordinary RCA cleaning" is the method of cleaning silicon wafers developed by RCA (see e.g., W. Kern and D. A. Puotinen, RCA Review, vol. 31, p. 187 (1970)). It is the process of cleaning a wafer with a washing water (often called "SC1") of 27% aqueous ammonia, 30% hydrogen peroxide solution and water at a 1:1:5 ratio (by volume), washing it with purified water, immersing it in a 1% dilute hydrofluoric acid solution, rinsing it with purified water, cleaning it in a washing water (often called "SC2") of 37% hydrochloric acid, 30% hydrogen peroxide solution and water at a 1:1:6 ratio (by volume), washing it with purified water, and then drying it. The cleaning with any washing water is carried out at a temperature of 75 to 85° C. for approximately 10 to 20 minutes.

The cleaning method is not particularly limited, and the wafer is washed, for example, by multi-tank batch cleaning, single-tank batch cleaning, sheet-fed cleaning, or the like. Ultrasonic wave or jet flow, for example, may be used for improving the cleaning efficiency.

EXAMPLES

<Experiment>

Hereinafter, the present invention will be described in more detail with reference to Experiments, but it should be understood that the present invention is not restricted by the following Experiments. Adequate changes and modifications may be made in the invention as far as they do not depart from the spirit and scope thereof described above or below and such modifications are also included in the scope of the present invention.

<Experiment 1>

In this Experiment, Cu contamination during silicon wafer polishing was studied by using various combinations of a polishing powder and a pH adjuster.

First, various polishing slurries shown in Table 1 were prepared. The polishing powder concentration was 5 weight %, and the amount of the pH adjuster was adjusted to make the pH of the slurry 10.5. Cu in the form of copper nitrate was added at 2 ppm deliberately to each of these slurries. The balance of the slurry was water.

A p-type silicon wafer having a diameter of 200 mm was polished by using each polishing slurry. The polishing was performed at a polishing pressure of 230 g/m$^2$ and a surface plate rotational rate of 35 rpm for 20 minutes by using a one-face polishing machine (4 heads, 3 wafer/head, surface plate diameter: 128 cm). The thicknesses of the wafer before and after polishing were determined by using an electrical capacitance non-contact plate thickness meter, and the polishing amount was calculated therefrom. Results are summarized in Table 1.

The polished wafer was then subjected to ordinary RCA cleaning (SC1 and SC2) for removal of the polishing powder and metals adhered on the surface, and the wafer was then completely dissolved in a mixed solution of high-purity 49% hydrofluoric acid and 69% nitric acid at a 3:2 ratio (by volume). The Cu concentration in the solution was determined by inductively coupled plasma mass spectrometry (ICP-MS). The Cu concentration in the wafer was estimated from the Cu concentration in the solution.

Results are summarized in Table 1.

TABLE 1

Results of Experiments by using polishing slurries deliberately added with Cu

| No. | Polishing powder | pH adjuster | Polishing amount ($\mu$m) | Cu concentration (atom/cm$^3$) |
|---|---|---|---|---|
| 1 | Colloidal silica | Ethanolamine | 10.7 | $2.5 \times 10^{14}$ |
| 2 | Colloidal silica | Ethylenediamine | 11.6 | $3.2 \times 10^{14}$ |
| 3 | Colloidal silica | TMAH | 9.5 | $2.8 \times 10^{13}$ |
| 4 | Cerium oxide | TMAH | 5.4 | $3.5 \times 10^{13}$ |
| 5 | Cerium oxide | Ethylenediamine | 8.9 | $2.9 \times 10^{14}$ |
| 6 | Zirconium oxide | TMAH | 9.8 | $1.4 \times 10^{13}$ |
| 7 | Zirconium oxide | Choline | 9.8 | $2.0 \times 10^{13}$ |

TABLE 1-continued

Results of Experiments
by using polishing slurries deliberately added with Cu

| | Polishing slurry component | | Polishing amount | Cu concentration |
|---|---|---|---|---|
| No. | Polishing powder | pH adjuster | (μm) | (atom/cm$^3$) |
| 8 | Zirconium oxide | Ethylenediamine | 11.2 | $2.9 \times 10^{14}$ |
| 9 | Colloidal zirconia | TMAH | 8.8 | $2.5 \times 10^{13}$ |

In the Table, the average particle diameters of respective polishing powders are as follows: colloidal silica, 70 nm; cerium oxide, 1.2 μm; zirconium oxide, 0.83 μm (crystallite size: 26 nm); and colloidal zirconia, 70 nm. TMAH represents tetramethylammonium hydroxide, and zirconium oxide was monoclinic.

As seen from Table 1, the combinations of a polishing powder and a pH adjuster that provide a silicon wafer well polished and less contaminated by Cu were those of colloidal silica and tetramethylammonium hydroxide (No. 3); monoclinic zirconium oxide and tetramethylammonium hydroxide (No. 6); monoclinic zirconium oxide and choline (No. 7); and colloidal zirconia and tetramethylammonium hydroxide (No. 9).

<Experiment 2>

In this Experiment, the efficiencies of removing non-metal films by the polishing slurries Nos. 3, 6, 7, and 9 in Table 1 were studied.

A p-type silicon wafer having a diameter of 200 mm was used in the Experiment. First, a wafer A having a silicon oxide film formed on the silicon wafer by thermal oxidation method and a wafer B having a silicon nitride film as the lower layer and a polysilicon film as the upper layer (called poly-Si back seal) formed on the silicon wafer were prepared. The thickness of the silicon oxide film was 2 μm, that of silicon nitride film 0.5 μm, and that of polysilicon film 1 μm.

The wafers A and B were polished by using each of the polishing slurries Nos. 3, 6, 7, and 9 shown in Table 1. Polishing was performed in a similar manner to Experiment 1, except that Cu was not deliberately added to the slurry and the polishing time was 5 minutes.

Then, the film-removing abilities of the respective polishing slurries were determined by visual observation of the surface of polished wafers and measurement of the surface resistance thereof by four-probe method. Results are summarized in Table 2.

TABLE 2

Film-removing ability of polishing slurries

| | Polishing slurry component | | Non-metal film | | |
|---|---|---|---|---|---|
| No. | Polishing powder | pH adjuster | SiO$_2$ film | Si$_3$N$_4$ film | poly-Si film |
| 3 | Colloidal silica | TMALH | X | X | ○ |
| 6 | Zirconium oxide | TMAH | ○ | ○ | ○ |
| 7 | Zirconium oxide | Choline | ○ | ○ | ○ |
| 9 | Colloidal zircoma | TMAH | X | X | ○ |

In the Table, SiO$_2$ film represents a silicon oxide film, Si$_3$N$_4$, a silicon nitride film; poly-Si film, a polysilicon film; and ○ represents complete removal of film, while X persistence of film.

As seen from Table 2, among the combinations of a polishing powder and a pH adjuster that provide a silicon wafer well polished and less contaminated by Cu, combinations thereof that are capable of removing all of the polysilicon film, silicon oxide film, and silicon nitride film are those of monoclinic zirconium oxide and tetramethylammonium hydroxide (No. 6); and monoclinic zirconium oxide and choline (No. 7).

<Experiment 3>

In this Experiment, it was confirmed whether it is possible to further reduce the Cu contamination of silicon wafer by adding a chelating agent to the polishing slurry containing monoclinic zirconium oxide and tetramethylammonium hydroxide.

Examined were two experimental methods: method A of polishing a silicon wafer by using a polishing slurry deliberately added with Cu and method B of polishing a wafer carrying a Cu film together with a bare wafer by using a polishing slurry without added Cu.

A p-type silicon wafer having a diameter of 200 mm was used for the experimental method A. In the experimental method B, a silicon wafer similar to that used in experimental method A was used as the bare wafer and additionally, a wafer carrying a Cu film having a thickness of 1 μm formed on a similar silicon wafer by sputtering was used.

First, the polishing slurry No. 6 shown in Table 1 was prepared. The polishing powder concentration was 5 weight %, and the amount of the pH adjuster was adjusted to make the pH of the slurry 10.5. Cu in the form of copper nitrate was added at 2 ppm deliberately to the polishing slurry used in the experimental method A; no chelating agent was added or alternatively, succinic acid was added at 0.015 weight %, or citric acid, ethylenediamine tetraacetic acid, diethylenetriamine pentaacetic acid, polyacrylic acid (weight-average molecular weight: 2,000) or polyacrylic acid (weight-average molecular weight: 300,000) was added either at 0.005 weight % or 0.015 weight % as the chelating agent. To the slurry used in the experimental method B, Cu was not added; no chelating agent was added, or alternatively, succinic acid was added at 0.015 weight %, or citric acid, ethylenediamine tetraacetic acid, diethylenetriamine pentaacetic acid, polyacrylic acid (weight-average molecular weight: 2,000) or polyacrylic acid (weight-average molecular weight: 300,000) was added either at 0.005 weight % or 0.015 weight % as the chelating agent.

A silicon wafer was polished by using each slurry in the experimental method A, while multiple wafers carrying a Cu film together with multiple bare wafers were polished in the experimental method B (two wafers carrying a Cu film and ten bare wafers per batch). Polishing was performed at a polishing pressure of 230 g/m$^2$ and a surface plate rotational rate of 35 rpm for 20 minutes by using a one-face polishing machine (4 heads, 3 wafer/head, surface plate diameter: 128 cm). The thicknesses of the wafer before and after polishing were determined by using an electrical capacitance non-contact plate thickness meter, and the polishing amount was calculated therefrom. Results are summarized in Table 3.

The polished wafer was then subjected to ordinary RCA cleaning (SC1 and SC2) for removal of the polishing powder and metals adhered on the surface, and the wafer was completely dissolved in a mixed solution of high-purity 49% hydrofluoric acid and 69% nitric acid at a 3:2 ratio (by volume). The Cu concentration in the solution was determined by inductively coupled plasma mass spectrometry (ICP-MS). The Cu concentration in the wafer was estimated from the Cu concentration in the solution. Results are summarized in Table 3.

the present invention including a film-removing step by chemical mechanical polishing using the polishing slurry, the following Experiment was conducted.

A used test wafer carrying a Cu film of 200 mm in diameter was reclaimed according to the method described below.

(1) Removal of Cu Film by Chemical Etching

A used test wafer carrying a Cu film was immersed in a mixed etchant of 37% hydrochloric acid, 69% nitric acid, and water at a 1:1:2 ratio (by volume) at room temperature for 10 minutes for removal of the Cu film exposed on the surface.

(2) Removal of Residual Film by Chemical Mechanical Polishing

The removal of the residual film by chemical mechanical polishing was carried out using the polishing slurry having the same composition as that of the slurry No. 21 in Table 3

TABLE 3

Effects of adding chelating agents

| No. | Chelating agent | Concentration (weight %) | Experimental method | Polishing amount (µm) | Cu concentration (atom/cm$^3$) |
|---|---|---|---|---|---|
| 10 | None | — | A | 9.8 | $1.4 \times 10^{13}$ |
| 11 | | | B | 9.3 | $2.8 \times 10^{13}$ |
| 12 | Succinic acid | 0.015 | A | 9.6 | $1.3 \times 10^{13}$ |
| 13 | | | B | 9.4 | $2.4 \times 10^{13}$ |
| 14 | Citric acid | 0.005 | A | 9.7 | $2.1 \times 10^{12}$ |
| 15 | | | B | 9.8 | $2.8 \times 10^{12}$ |
| 16 | | 0.015 | A | 9.5 | $8.2 \times 10^{11}$ |
| 17 | | | B | 9.5 | $1.1 \times 10^{12}$ |
| 18 | EDTA | 0.005 | A | 9.6 | $1.5 \times 10^{12}$ |
| 19 | | | B | 9.8 | $2.2 \times 10^{12}$ |
| 20 | | 0.015 | A | 10.0 | $<5 \times 10^{11}$ |
| 21 | | | B | 9.6 | $<5 \times 10^{11}$ |
| 22 | DTPA | 0.005 | A | 9.7 | $<5 \times 10^{11}$ |
| 23 | | | B | 10.2 | $1.2 \times 10^{12}$ |
| 24 | | 0.015 | A | 9.4 | $<5 \times 10^{11}$ |
| 25 | | | B | 9.4 | $<5 \times 10^{11}$ |
| 26 | Polyacrylic acid (1) | 0.005 | A | 9.8 | $<5 \times 10^{11}$ |
| 27 | | | B | 9.4 | $6.5 \times 10^{11}$ |
| 28 | | 0.015 | A | 9.6 | $<5 \times 10^{11}$ |
| 29 | | | B | 9.7 | $<5 \times 10^{11}$ |
| 30 | Polyacrylic acid (2) | 0.005 | A | 9.5 | $<5 \times 10^{11}$ |
| 31 | | | B | 9.3 | $7.2 \times 10^{11}$ |
| 32 | | 0.015 | A | 9.6 | $<5 \times 10^{11}$ |
| 33 | | | B | 9.7 | $<5 \times 10^{11}$ |

In the Table, EDTA represents ethylenediamine tetraacetic acid and DTPA diethylenetriamine pentaacetic acid. The polyacrylic acid (1) had a weight-average molecular weight of 2,000, and the polyacrylic acid (2) an weight-average molecular weight of 300,000.

As seen from Table 3, among various carboxylic acids, an addition of the carboxylic acid having three or more carboxyl groups in the molecule, i.e., citric acid, EDTA, DTPA or polyacrylic acid as the chelating agent is effective in reducing the Cu contamination of wafers during polishing by 5 to 50 times or more compared with the case where such chelating agents are not added. In contrast, the advantageous effect of preventing Cu contamination during polishing is not observed by adding the carboxylic acid having two carboxyl groups in the molecule, i.e., succinic acid, as the chelating agent.

<Experiment 4>

Experiments 1 to 3 demonstrated that the polishing slurry according to the present invention has a higher ability in removing various non-metal films and prevents Cu contamination of wafers during polishing even when wafers carrying a Cu film are mixed in the polishing process. To examine the efficiency of the method of reclaiming wafers according to (i.e., the slurry containing zirconium oxide at 5 weight % and EDTA at 0.015 weight % which was adjusted to pH 10.5 by adding tetramethylammonium hydroxide). Polishing was performed at a polishing pressure of 230 g/m$^2$ and a surface plate rotational rate of 35 rpm for 5 minutes by using a one-face polishing machine (4 heads, 3 wafer/head, surface plate diameter: 128 cm).

(3) Preliminary Cleaning and Mirror Polishing

After the removal of the residual film was completed, the wafer was cleaned with a mixed washing water of 27% aqueous ammonia, 30% hydrogen peroxide solution, and water at a 1:1:5 ratio (by volume) and then with a mixed washing water of 49% hydrofluoric acid, 30% hydrogen peroxide solution, and water at a 1:1:100 ratio. The preliminary cleaning was carried out at 60° C. for 10 minutes in the ammonia-hydrogen peroxide washing water and at room temperature for 10 minutes in the hydrofluoric acid-hydrogen peroxide washing water. Then, the wafer was mirror-polished by using an ordinary polishing slurry for silicon wafer containing alkaline colloidal silica. The mirror polishing was carried out as divided into primary polishing and final polishing. Each polishing was performed at a polishing pressure of 230 g/m$^2$ and a surface plate rotational rate of 35 rpm for 10 minutes by using a one-face polishing machine (4 heads, 3 wafer/head, surface plate diameter: 128 cm).

(4) Final Cleaning and Analysis of Surface Metal

The wafer after final polishing was subjected to ordinary RCA cleanings (SC1 and SC2); a wafer was picked up as a sample in each batch of the chemical mechanical polishing described above (2); and the surface metals were analyzed by vapor phase decomposition-inductively coupled plasma mass spectrometry (VPD-ICP-MS). Each of the five wafers analyzed had surface concentrations of Al, Ca, Cr, Cu, Fe, K, Mg, Na, Ni, and Zn of $5\times10^9$ atom/cm$^2$ or less, and 30 or fewer light point defects with the size of 0.16 µm or more, demonstrating that the wafer has a quality sufficient for use as a regenerated wafer.

Even though reclaimed from a used test wafer carrying a Cu film, the reclaimed wafer had a surface concentration of Cu as low as the surface concentration of other metals, indicating that the metal contamination of the wafer, in particular Cu contamination, was effectively prevented. The results also indicate that there is no need for separating wafers carrying a Cu film from used test wafers during the wafer reclamation and all wafers reclaimed are substantially free from Cu contamination even when wafers carrying a Cu film are mixed in the polishing process.

What is claimed is:

1. A polishing slurry having a pH of 9 to 12 and being essentially free from an organic amine, comprising:
    monoclinic zirconium oxide particles having a crystallite size of 10 to 1,000 nm and an average particle diameter of 30 to 2,000 nm in an amount of 1 to 20 weight %;
    at least one carboxylic acid having four or more carboxyl groups in the molecule; and
    at least one quaternary alkylammonium hydroxide.

2. The polishing slurry according to claim 1, wherein the quaternary alkylammonium hydroxide is at least one compound selected from the group consisting of tetramethylammonium hydroxide, tetraethylammonium hydroxide, and choline.

3. The polishing slurry according to claim 1, wherein the carboxylic acid having four or more carboxyl groups in the molecule is at least one compound selected from the group consisting of ethylenediamine tetraacetic acid and the salts thereof, and diethylenetriamine pentaacetic acid and the salts thereof.

4. A method comprising:
    polishing a test wafer with the polishing slurry of claim 1;
    mirror-polishing at least one side of the wafer; and
    cleaning the wafer.

5. The method according to claim 4, further comprising removing at least part of a film on the test wafer by chemical etching before polishing.

6. The method according to claim 4, further comprising cleaning the wafer after polishing and before mirror-polishing at least one side of the wafer.

7. The method according to claim 4, wherein the quaternary alkylammonium hydroxide is at least one compound selected from the group consisting of tetramethylammonium hydroxide, tetraethylammonium hydroxide and choline.

8. The method according to claim 4, wherein the carboxylic acid having four or more carboxyl groups in the molecule is at least one compound selected from the group consisting of ethylenediamine tetraacetic acid and the salts thereof, and diethylenetriamine pentaacetic acid and the salts thereof.

9. The polishing slurry according to claim 1, wherein the monoclinic zirconium oxide particles have an average particle diameter of 30 to 1,000 nm.

10. The polishing slurry according to claim 1, wherein the monoclinic zirconium oxide particles are present in an amount of 2 to 10 weight %.

11. The polishing slurry according to claim 9, wherein the monoclinic zirconium oxide particles are present in an amount of 2 to 10 weight %.

12. The method according to claim 4, wherein the monoclinic zirconium oxide particles have an average particle diameter of 30 to 1,000 nm.

13. The method according to claim 4, wherein the monoclinic zirconium oxide particles are present in an amount of 2 to 10 weight %.

14. The method according to claim 12, wherein the monoclinic zirconium oxide particles are present in an amount of 2 to 10 weight %.

15. The polishing slurry according to claim 1, further comprising at least one carboxylic acid having three carboxyl groups in the molecule.

16. The polishing slurry according to claim 15, wherein the carboxylic acid having three carboxyl groups in the molecule is at least one compound selected from the group consisting of citric acid and the salts thereof, and isocitric acid and the salts thereof.

17. The polishing slurry according to claim 9, further comprising at least one carboxylic acid having three carboxyl groups in the molecule.

18. The polishing slurry according to claim 17, wherein the carboxylic acid having three carboxyl groups in the molecule is at least one compound selected from the group consisting of citric acid and the salts thereof, and isocitric acid and the salts thereof.

19. The polishing slurry according to claim 10, further comprising at least one carboxylic acid having three carboxyl groups in the molecule.

20. The polishing slurry according to claim 19, wherein the carboxylic acid having three carboxyl groups in the molecule is at least one compound selected from the group consisting of citric acid and the salts thereof, and isocitric acid and the salts thereof.

* * * * *